Figure 1:
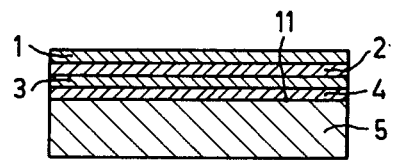

United States Patent [19]

Tijburg

[11] 4,049,488
[45] Sept. 20, 1977

[54] METHOD OF MANUFACTURING A SEMICONDUCTOR DEVICE

[75] Inventor: Rudolf Paulus Tijburg, Eindhoven, Netherlands

[73] Assignee: U.S. Philips Corporation, New York, N.Y.

[21] Appl. No.: 675,178

[22] Filed: Apr. 8, 1976

[30] Foreign Application Priority Data

May 1, 1975 Netherlands .................. 7505134

[51] Int. Cl.² ........................................ H01L 21/312
[52] U.S. Cl. .................................... 156/655; 156/662; 252/79.2; 252/79.4; 357/16
[58] Field of Search ............... 156/3, 7, 11, 17, 652, 156/655, 656, 659, 662; 357/16–19; 252/79.4, 79.2, 79.5, 79.1; 29/580

[56] References Cited

U.S. PATENT DOCUMENTS

| 3,772,100 | 11/1973 | Masuda et al. | 156/3 |
| 3,801,391 | 4/1974 | Dyment et al. | 156/17 X |
| 3,833,435 | 9/1974 | Logan et al. | 156/11 |
| 3,954,534 | 5/1976 | Scifres et al. | 156/7 |

*Primary Examiner*—William A. Powell
*Attorney, Agent, or Firm*—Frank R. Trifari

[57] ABSTRACT

The invention relates to a method of manufacturing a semiconductor device in which an etching process is used so as to etch regions consisting of $A^{III}B^V$ compounds selectively relative to each other. According to the invention in the etching process an etching bath is used having a water-dissolved oxidizing material and a reducing material constituting together a redox system. In such an etching bath with redox system the selectivity is established by the choice of the concentrations of the materials and of the pH.

15 Claims, 6 Drawing Figures

METHOD OF MANUFACTURING A SEMICONDUCTOR DEVICE

This invention relates to the manufacture of a semiconductor device having a semiconductor body of $A^{III}B^V$ semiconductor material and comprising two adjoining regions of different compositions, one of the regions being etched selectively relative to the other region in a solution of an oxidising material in water, and to a semiconductor device manufactured by the method.

The expression $A^{III}B^V$ semiconductor material includes components of one or more elements of group IIIA with one or more elements of group VA of the Periodic Table of elements.

The expression different compositions comprises differences in kind and concentration of the said elements as well as differences in conductivity types of the regions.

In an article by Kobayashi and Sugiyama in Japanese Journal Applied Physics 12 619–620 (1973) the etching of aluminium gallium arsenide and gallium arsenide is described. The oxidation agent used is hydrogen peroxide and it was found that the ratio of the etching rates of aluminium gallium arsenide and gallium arsenide depends on the hydrogen peroxide concentration and that in such manner that said ratio is larger than 1:1 with lower hydrogen peroxide concentrations and is smaller than 1:1 with higher hydrogen peroxide concentrations. With the described etching bath it is not possible to etch aluminium gallium arsenide significantly selectively relative to gallium arsenide because the ratio of the etching rates cannot be adjusted sufficiently above the value 1:1.

The difference in etching rate of materials differing only in conductivity type (dopant) as described in the said publication, is also very small or is absent. Furthermore the composition (aluminium content) of the region to be etched should differ considerably from the region not to be etched.

One of the objects of the invention is to provide a method in which, with a smaller dependence on composition differences, one region can be etched selectively relative to the other region with significantly different etching rates and in which etched surfaces of a good quality are obtained.

The method according to the invention is characterized in that the starting solution in etching is a solution to which, besides the oxidising material, a reducing material has been added which forms a redox system with the oxidising material, and the concentrations of the said oxidising and reducing materials, as well as the pH of the solution, are chosen to be so that the ratio of the etching rates of the regions is at least 10:1.

With the method according to the invention, an incalculable number of redox systems may be used from which, by simple experiments, favourable conditions for the selective etching can be established, as will be illustrated inter alia with reference to a number of examples.

Although a quantitative explanation of the large differences in etching rates is lacking, it is obvious to assume that, as a result of the concentrations of the oxidising and reducing materials, the redox potential in the etching solution is fixed, which potential, together with the pH, determines the etching behaviour of the $A^{III}B^V$ compound.

By means of the method according to the invention the said ratio is preferably chosen to be larger than 20:1 and even larger than 50:1.

As will be explained hereinafter, when the method according to the invention is applied to a semiconductor body the regions of which consist of gallium arsenide and aluminium gallium arsenide, respectively, particularly good results are obtained, for example, when aluminium gallium arsenide of the formula $Al_{0.03}Ga_{0.97}As$ and gallium arsenide are to be etched selectively relative to each other. For the application of the method according to the invention, the regions need not consist of different $A^{III}B^V$ compounds, but the etching behaviour of an etching solution can be adjusted to be so selective that said method can be used advantageously if the regions show different conductivity types and consist of the same $A^{III}B^V$ compound.

With the knowledge of the method according to the invention it is therefore not surprising that by variation of the concentrations of the oxidising and reducing materials and/or the pH, the selectivity of the redox system used can in many cases be reversed.

Upon reversing the selectivity, the concentrations and/or the pH traverse a track in which there is not etched selectively but in which the level of the etching rates is also low. In this connection also the method according to the invention is distinguished from etching with exclusively an oxidation agent in which in a region where no selectivity occurs the level of the etching rates is high.

The selective etching with a redox system is preferably used with a solution containing potassium ferricyanide and potassium ferrocyanide, with a solution which contains ceri and cero ions, with a solution which contains ferri and ferro ions, with a solution which contains hydroquinone and quinone or with a solution which contains triiodide and iodide ions.

The invention furthermore relates to a semiconductor device manufactured by means of the method according to the invention.

Since both the concentrations of the oxidising and the reducing materials and the pH are parameters for the etching behaviour, an etching solution may often be chosen of which, for example, the pH can also satisfy other conditions, for example, is chosen to be so that metallic contacts already present on the semiconductor body are not attached or photo lacquer layers can be used for the local performance of the method according to the invention.

The method according to the invention enables simultaneously both a selective and a preferential etching. The etching rate in the preferential etching depends on the crystal orientation.

The semiconductor devices manufactured by means of the method according to the invention comprise for example electroluminescent devices and lasers, in particular double hetero junction injection lasers, which are used, for example, together with optical fibre bundles for telecommunication purposes.

The invention will now be described in greater detail with reference to a few examples and the accompanying drawing.

Figure 2:
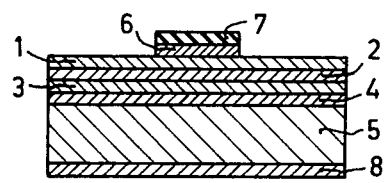
Figure 3:
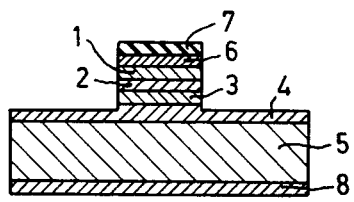
Figure 4:
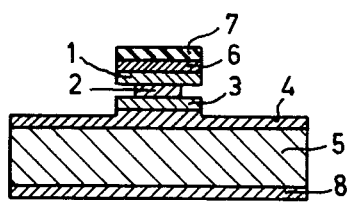
Figure 5:
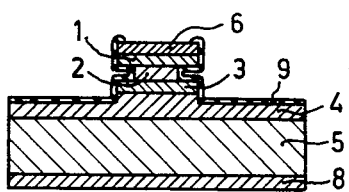
Figure 6:
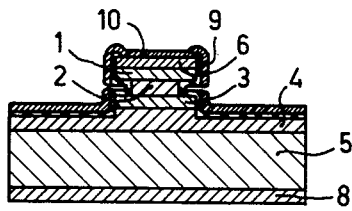

FIGS. 1 to 6 are sectional views of a device in a number of successive stages of manufacture by means of the method according to the invention.

EXAMPLE I.

This example describes the manufacture of a double hetero junction injection laser (see FIGS. 1 to 6). Starting material in this example is in a usual manner an n-type gallium arsenide substrate 5 having a thickness of 100 μm and a concentration of $2 \times 10^{18}$ tellurium atoms per cm$^3$.

By means of liquid phase epitaxy there are grown successively on the (100) face 11 of the substrate 5 a layer 4 of n-$Al_{0.3}Ga_{0.7}As$ having a thickness of 5 μm and a tin concentration of $5 \times 10^{17}$ atoms per cm$^3$, a layer 3 of p-gallium arsenide having a thickness of 0.4 μm and a germanium concentration of $5 \times 10^{17}$ atoms/cm$^3$, a layer 2 of p-$Al_{0.3}Ga_{0.7}As$ having a thickness of 1 μm and a germanium concentration of $5 \times 10^{17}$ atoms/cm$^3$ and a p-gallium arsenide layer 1 having a thickness of 1.5 μm and a germanium concentration of $2 \times 10^{18}$ atoms/cm$^3$. The layer 3 is the active laser layer in which electrons are injected from the layer 4. Layer 3 is separated from the layers 2 and 4 by hetero junctions which are essential for the laser action. Layer 1 and substrate 5 also form hetero junctions with the layers 2 and 4, respectively, the last-mentioned hetero junctions being provided because gallium arsenide can be better contacted than aluminium gallium arsenide.

For contacting layer 1 there are provided by means of a vapour deposition process a 0.5 μm thick layer 6 consisting of 98% by weight of silver and 2% by weight of beryllium and a 0.5 μm thick layer 8 consisting of 98% by weight of silver and 2% by weight of silicon on the substrate 5. A photoresist layer 7 is also provided on the layer 6 after which said layers are given the shape of 20 μm wide strips in a (110) orientation by means of a photoetching process.

The layers 1 to 4 are etched in a non-selective etching bath consisting of 3 parts by weight of sulphuric acid in 1 part by weight of 30% hydrogen peroxide in 1 part by weight of water using the layers 6 and 7 as a mask. Etching is continued till the sides of the layer 3 are exposed. This is reached with certainty when the layer 4 has also been attacked by the etching.

No selective etching is desired for etching through the layers because in that case considerable underetching may occur. In the non-selective etching, some underetching also occurs but this is not considerable.

The p-type aluminium gallium arsenide layer 2 is then etched selectively relative to the p-type gallium arsenide layers 1 and 3, a solution being used with water as a solvent to which, per 50 cm$^3$, 50 mg of $Ce(SO_4)_2.4H_2O$ as an oxidising material and 50 mg of $Ce(NO_3)_3.6H_2O$ as a reducing material have been added. The said materials forms a redox system. A pH of approximately 1.5 is adjusted by the addition of sulphuric acid.

At this pH the etching rate of gallium arsenide is immeasurably small and aluminium gallium arsenide is etched at a rate of approximately 10 μm per hour.

The layers 1 and 3 show no rounding off at the side faces. The ratio of the etching rates of aluminium gallium arsenide and gallium arsenide is certainly larger than 100:1.

By the selective etching of layer 2 a current limitation of layer 3 is achieved so that the place where laser beams are generated in the layer 3 is readily defined.

At considerably higher pH than described above, for example 2.8, the selectivity of the etching solution remains but the etching rate of aluminium gallium arsenide decreases slightly. At pH < 1.25 this selectivity decreases.

The thickness of the n-type aluminium gallium arsenide layer 4 decreases slightly or does not decrease so that the example described also illustrates how layer 2 is etched selectively relative to layer 4.

The layer 7 may be removed in a usual manner and layers 6 and 8 may be alloyed with the adjoining layers by a thermal treatment at 580° C in $H_2$ for 2½ minutes. A 1500 A thick pyrolytic $SiO_2$ layer 9 having a window is then provided on layer 6. A ½ μm thick silver beryllium layer 10 is vapour-deposited on the upper face and alloyed at 580° C in a hydrogen atmosphere for 2½ minutes, after which the resulting diode may be mounted on a base.

EXAMPLE II

Etching aluminium gallium arsenide selectively relative to gallium arsenide may also be performed in a solution which contains per 50cm$^3$ of water 3.8 g of $K_3Fe(CN)_6$ and 4.1 g of $K_4FE(CN)_6$ and which is given a pH smaller than 9.

With the last-mentioned redox system the selectivity is reversed and hence gallium arsenide is etched selectively relative to aluminium gallium arsenide if, for example, by the addition of NaOH, the pH is made equal to or larger than 9.5.

In this system a ratio of etching rates of 15:1 is achieved.

EXAMPLE III

A selective etching of aluminium gallium arsenide relative to gallium arsenide is obtained in a redox system containing per 50 cm$^3$ of $H_2O$, 630 mg of $FeCl_2$ and 810 mg of $FeCl_3$ at a pH = 1.7.

The ratio of the etching rate of aluminium gallium-arsenide : gallium arsenide is 15:1.

EXAMPLE IV

Large ratios of the etching rates are obtained with a redox system containing per 50 cm$^3$ of $H_2O$ 1.7 g of $KI_3$ and 1.8 g of KI. When the pH is brought to 9.5 by the addition of NaOH, the ratio of the etching rates of gallium arsenide and aluminium gallium arsenide is 100:1.

At pH ≦ 3.0 the selectivity is reversed.

EXAMPLE V

In the redox system quinone-hydroquinone containing per 50 ml of $H_2O$ 150 mg of quinone and 50 mg of hydroquinone, at pH = 1.8 aluminium gallium arsenide is etched selectively relative to gallium arsenide, at pH = 7.2 gallium arsenide is etched selectively relative to aluminium gallium arsenide, and at pH = 9.5 aluminium gallium arsenide is etched selectively relative to gallium arsenide.

The ratios of the etching rates are approximately 15:1.

At pH = 1.8 p-type aluminium gallium arsenide is also etched selectively relative to n-type gallium arsenide.

With a composition of the etching bath containing per 50 cm$^3$ of water 100 mg of quinone and 5 mg of hydroquinone and pH = 3, n-type aluminium gallium arsenide is etched selectively relative to p-type aluminium gallium arsenide, n-type gallium arsenide and p-type gallium arsenide.

The invention is not restricted to the embodiments described but may also be applied to systems other than gallium arsenide-aluminium gallium arsenide, for example, those in which gallium or aluminium is replaced by indium, and arsenide is replaced at least partly by phosphorus, for example the systems GaP-$In_{0.5}Ga_{0.5}P$ and GaP-$Al_{0.6}Ga_{0.4}As$.

The two last-mentioned systems may be etched in etching baths containing triiodide-iodide and ferricyanide-ferrocyanide redox systems having a reversible selectivity for example as described in the above examples.

For example, the etching rate is found to be dependent considerably on the indium content in $In_{1-x}Ga_xAs$.

The aluminium concentrations may also have values other than those stated.

By means of the method according to the invention light-emissive diodes having spontaneous emission can be manufactured.

What is claimed is:

1. A method of manufacturing a semiconductor device having a semiconductor body of $A^{III}B^V$ semiconductor material and comprising two adjoining regions of different compositions, one of the regions being etched selectively relative to the other region in a solution of an oxidizing material in water, comprising the steps of providing an etching solution consisting of said oxidizing material and a reducing material which forms a redox system with said oxidizing material, the concentrations of said oxidizing and reducing materials, as well as the pH of the solution, being chosen to be such that the ratio of the relative etching rates of said regions is at least 10:1, and etching said body with said etching solution.

2. A method as in claim 1, wherein said ratio of etching rates is at least 20:1.

3. A method as in claim 1, wherein said ratio of etching rates is at least 50:1.

4. A method as in claim 1, wherein one said region consists essentially of gallium arsenide and the other said region consists essentially of aluminium gallium arsenide.

5. A method as in claim 1, wherein said regions are of opposite conductivity types and are of the same $A^{III}B^V$ compound.

6. A method as in claim 1, wherein said redox system contains potassium ferricyanide and potassium ferrocyanide.

7. A method as in claim 1, wherein said redox system contains cero-ions and ceri-ions.

8. A method as in claim 1, wherein said redox system contains ferri-ions and ferro-ions.

9. A method as in claim 1, wherein said redox system contains quinone and hydroquinone.

10. A method as in claim 1, wherein said redox system contains triiodide ions and iodide ions.

11. A method as in claim 1, wherein one of said regions consists essentially of gallium arsenide and the other of said regions consists essentially of aluminium gallium arsenide and said redox system comprises materials selected from the group consisting of potassium ferricyanide and potassium ferrocyanide, ceri-ions and cero-ions, ferro-ions and ferri-ions, hydroquinone and quinone, and triodide and iodide ions.

12. A method as in claim 1, wherein said redox system comprises ceri and cero ions and said pH level is about 1.5, said ceri and cero ions being $Ce(SO_4)_2 \cdot 4H_2O$ and $Ce(NO_3)_3 \cdot 6H_2O$.

13. A method as in claim 1, wherein said redox system comprises ferri and ferro ions and said pH level is about 1.7, said ferri and ferro ions being $FeC_3$ and $FeC_2$.

14. A method as in claim 1, wherein said redox system comprises potassium ferricyanide and potassium ferrocyanide and said pH level is less than about 9.

15. A method as in claim 1, wherein said redox system comprises triodide and iodide ions and said pH level is about from 3.0 to 9.5.

* * * * *

UNITED STATES PATENT AND TRADEMARK OFFICE
CERTIFICATE OF CORRECTION

PATENT NO. : 4,049,488
DATED : September 20, 1977
INVENTOR(S) : RUDOLF PAULUS TIJBURG ET AL It is certified that error appears in the above-identified patent and that said Letters Patent are hereby corrected as shown below:

Column 1, line 17, "different compositions" should be

--"different compositions"--

Column 2, line 49, "attached" should be --attacked--

Signed and Sealed this

Seventh Day of February 1978

[SEAL]

Attest:

RUTH C. MASON
Attesting Officer

LUTRELLE F. PARKER
Acting Commissioner of Patents and Trademarks